United States Patent
Liu et al.

(10) Patent No.: US 11,924,982 B2
(45) Date of Patent: Mar. 5, 2024

(54) CURVED DISPLAY APPARATUS AND METHOD OF FABRICATING CURVED DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Chang Liu, Beijing (CN); Chao Wang, Beijing (CN); Zhiliang Jiang, Beijing (CN); Pan Zhao, Beijing (CN); Qian Ma, Beijing (CN); Dianjie Hou, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 309 days.

(21) Appl. No.: 17/434,401

(22) PCT Filed: Nov. 17, 2020

(86) PCT No.: PCT/CN2020/129375
§ 371 (c)(1),
(2) Date: Aug. 26, 2021

(87) PCT Pub. No.: WO2022/104513
PCT Pub. Date: May 27, 2022

(65) Prior Publication Data
US 2022/0354003 A1    Nov. 3, 2022

(51) Int. Cl.
*H05K 5/00*      (2006.01)
*B32B 1/00*      (2006.01)
(Continued)

(52) U.S. Cl.
CPC ............. *H05K 5/0018* (2022.08); *B32B 1/00* (2013.01); *B32B 7/12* (2013.01); *B32B 15/04* (2013.01);
(Continued)

(58) Field of Classification Search
CPC .............. B32B 1/00; B32B 7/12; B32B 15/04
(Continued)

(56) References Cited

U.S. PATENT DOCUMENTS

2016/0270210 A1    9/2016   Shin
2017/0130101 A1    5/2017   Heimink et al.
(Continued)

FOREIGN PATENT DOCUMENTS

CN     106661394 A    5/2017
CN     206678516 U    11/2017
(Continued)

OTHER PUBLICATIONS

International Search Report & Written Opinion dated Aug. 16, 2021, regarding PCT/CN2020/129375.

*Primary Examiner* — Binh B Tran
(74) *Attorney, Agent, or Firm* — Intellectual Valley Law, P.C.

(57) ABSTRACT

A curved display apparatus is provided, including one or more bending portions where the curved display apparatus is bent. At least the one or more bending portions of the curved display apparatus including a stacked structure, which includes a support layer; a display panel on the support layer; and N number of pressure sensitive adhesive layers and M number of flexible base layers between the support layer and the display panel, N is an integer equal to or greater than 3, M is an integer equal to or greater than 2. A first one of the N number of pressure sensitive adhesive layers adheres the support layer and a first one of the M (Continued)

number of flexible base layers together. A last one of the N number of pressure sensitive adhesive layers adheres the display panel and a last one of the M number of flexible base layers together.

12 Claims, 6 Drawing Sheets

(51) Int. Cl.
  *B32B 7/12* (2006.01)
  *B32B 15/04* (2006.01)
  *B32B 15/20* (2006.01)
  *B32B 17/06* (2006.01)
  *B32B 37/12* (2006.01)
  *B32B 38/00* (2006.01)

(52) U.S. Cl.
  CPC .............. *B32B 15/20* (2013.01); *B32B 17/06* (2013.01); *B32B 37/12* (2013.01); *B32B 38/0012* (2013.01); *B32B 2307/42* (2013.01); *B32B 2307/546* (2013.01); *B32B 2307/732* (2013.01); *B32B 2311/12* (2013.01); *B32B 2311/24* (2013.01); *B32B 2315/08* (2013.01); *B32B 2457/20* (2013.01)

(58) Field of Classification Search
  USPC .......................................................... 361/807
  See application file for complete search history.

(56) References Cited

U.S. PATENT DOCUMENTS

| | | | |
|---|---|---|---|
| 2020/0133342 A1 | 4/2020 | Choi et al. | |
| 2020/0251679 A1 | 8/2020 | Ha et al. | |
| 2022/0151082 A1* | 5/2022 | Kim | G06F 1/1616 |
| 2022/0191312 A1* | 6/2022 | Yan | H04M 1/0214 |

FOREIGN PATENT DOCUMENTS

| | | |
|---|---|---|
| CN | 108192520 A | 6/2018 |
| CN | 109456711 A | 3/2019 |
| CN | 209015622 U | 6/2019 |
| CN | 110484156 A | 11/2019 |
| CN | 110819258 A | 2/2020 |
| CN | 111105710 A | 5/2020 |
| CN | 111445796 A | 7/2020 |
| CN | 111524934 A | 8/2020 |
| KR | 20190043428 A | 4/2019 |

* cited by examiner

CURVED DISPLAY APPARATUS AND METHOD OF FABRICATING CURVED DISPLAY APPARATUS

CROSS-REFERENCE TO RELATED APPLICATION

This application is a national stage application under 35 U.S.C. § 371 of International Application No. PCT/CN2020/131385, filed Nov. 17, 2020, the contents of which are incorporated by reference in the entirety.

TECHNICAL FIELD

The present invention relates to display technology, more particularly, to a curved display apparatus and a method of fabricating a curved display apparatus.

BACKGROUND

Convention display apparatuses are usually flat display apparatuses. In recent years, display devices having a curved display surface have been proposed for design or other reasons. Curved display apparatuses have found applications in computer monitors, televisions, personal portable devices, and display screen mounted in a vehicle.

SUMMARY

In one aspect, the present disclosure provides a curved display apparatus, comprising one or more bending portions where the curved display apparatus is bent; wherein at least the one or more bending portions of the curved display apparatus comprises a stacked structure comprising a support layer; a display panel on the support layer; and N number of pressure sensitive adhesive layers and M number of flexible base layers between the support layer and the display panel, N is an integer equal to or greater than 3, M is an integer equal to or greater than 2; wherein the N number of pressure sensitive adhesive layers and the M number of flexible base layers are alternately arranged; a first one of the N number of pressure sensitive adhesive layers adheres the support layer and a first one of the M number of flexible base layers together; a last one of the N number of pressure sensitive adhesive layers adheres the display panel and a last one of the M number of flexible base layers together; a respective one of the N number of pressure sensitive adhesive layers has a thickness in a range of 30 μm to 55 μm; a respective one of the M number of flexible base layers has a thickness in a range of 20 μm to 40 μm; and a ratio of the thickness of the respective one of the N number of pressure sensitive adhesive layers to the thickness of the respective one of the M number of flexible base layers is in a range of 0.75 to 2.75.

Optionally, the ratio of the thickness of the respective one of the N number of pressure sensitive adhesive layers to the thickness of the respective one of the M number of flexible base layers is in a range of 1.5 to 1.375.

Optionally, the curved display apparatus further comprises a substantially flat portion connected to the one or more bending portions; wherein the stacked structure is a structure extending throughout the substantially flat portion and the one or more bending portions; the stacked structure is bent in the one or more bending portions; and the N number of pressure sensitive adhesive layers and the M number of flexible base layers extend throughout the substantially flat portion and the one or more bending portions.

Optionally, the support layer is a metal support layer.

Optionally, the stacked structure further comprises a polarizer on a side of the display panel away from the support layer; an optical clear adhesive layer on a side of the polarizer away from the display panel; and a cover on a side of the optical clear adhesive layer away from the polarizer.

Optionally, the respective one of the N number of pressure sensitive adhesive layers comprises an acrylate-based adhesive material; and the respective one of the M number of flexible base layers comprises an organic material.

Optionally, an n-th pressure sensitive adhesive layer of the N number of pressure sensitive adhesive layers is adhered to two adjacent flexible base layers of the M number of flexible base layers, 1<n<N; and an m-th flexible base layer of the M number of flexible base layers is adhered to two adjacent pressure sensitive adhesive layers of the N number of pressure sensitive adhesive layers, 1≤m≤M.

In another aspect, the present disclosure provides a method of fabricating a curved display apparatus, comprising providing a display panel; providing a support layer; adhering the display panel and the support layer using N number of pressure sensitive adhesive layers and M number of flexible base layers, N is an integer equal to or greater than 3, M is an integer equal to or greater than 2; and bending an assembly comprising the display panel, the support layer, the N number of pressure sensitive adhesive layers, and the M number of flexible base layers, thereby forming one or more bending portions in the assembly; wherein adhering the display panel and the support layer comprises adhering a first one of the N number of pressure sensitive adhesive layers to a surface of the support layer, thereby adhering the support layer and a first one of the M number of flexible base layers together; and adhering a display panel to a last one of the N number of pressure sensitive adhesive layers, thereby adhering the display panel and a last one of the M number of flexible base layers together; wherein at least the one or more bending portions is formed to comprise a stacked structure comprising sequentially the support layer, the N number of pressure sensitive adhesive layers and the M number of flexible base layers, and the display panel; the N number of pressure sensitive adhesive layers and the M number of flexible base layers are alternately arranged; a respective one of the N number of pressure sensitive adhesive layers has a thickness in a range of 30 μm to 55 μm; a respective one of the M number of flexible base layers has a thickness in a range of 20 μm to 40 μm; and a ratio of the thickness of the respective one of the N number of pressure sensitive adhesive layers to the thickness of the respective one of the M number of flexible base layers is in a range of 0.75 to 2.75.

Optionally, the ratio of the thickness of the respective one of the N number of pressure sensitive adhesive layers to the thickness of the respective one of the M number of flexible base layers is in a range of 1.5 to 1.375.

Optionally, bending the assembly further forms a substantially flat portion connected to the one or more bending portions; wherein the stacked structure is a structure extending throughout the substantially flat portion and the one or more bending portions; the stacked structure is bent in the one or more bending portions; and the N number of pressure sensitive adhesive layers and the M number of flexible base layers extend throughout the substantially flat portion and the one or more bending portions.

Optionally, the method further comprises forming a polarizer on a side of the display panel away from the support layer; forming an optical clear adhesive layer on a side of the polarizer away from the display panel; and forming a cover on a side of the optical clear adhesive layer away from the polarizer.

Optionally, the method further comprises forming an adhesive module by forming a stacked structure comprising the N number of pressure sensitive adhesive layers and the M number of flexible base layers alternately stacked together, a first protective film, and a second protective film.

Optionally, the method further comprises forming an adhesive support module; wherein forming the adhesive support module comprises removing the first protective film from the adhesive module; and adhering the support layer to the first one of the N number of pressure sensitive adhesive layers to the surface of the support layer.

Optionally, the method further comprises removing the second protective film from the adhesive module; and adhering the display panel to the last one of the N number of pressure sensitive adhesive layers.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a curved display apparatus and a method of fabricating a curved display apparatus that substantially obviate one or more of the problems due to limitations and disadvantages of the related art. In one aspect, the present disclosure provides a curved display apparatus. In some embodiments, the curved display apparatus includes one or more bending portions where the curved display apparatus is bent.

In some embodiments, at least the one or more bending portions of the curved display apparatus includes a stacked structure includes a support layer; a display panel on the support layer, and N number of pressure sensitive adhesive layers and M number of flexible base layers between the support layer and the display panel, N is an integer equal to or greater than 3, M is an integer equal to or greater than 2.

Optionally, the N number of pressure sensitive adhesive layers and the M number of flexible base layers are alternately arranged. Optionally, a first one of the N number of pressure sensitive adhesive layers adheres the support layer and a first one of the M number of flexible base layers together. Optionally, a last one of the N number of pressure sensitive adhesive layers adheres the display panel and a last one of the M number of flexible base layers together. Optionally, a respective one of the N number of pressure sensitive adhesive layers has a thickness in a range of 30 μm to 55 μm. Optionally, a respective one of the M number of flexible base layers has a thickness in a range of 20 μm to 40 μm. Optionally, a ratio of the thickness of the respective one of the N number of pressure sensitive adhesive layers to the thickness of the respective one of the M number of flexible base layers is in a range of 0.75 to 2.75.

Figure 1A:
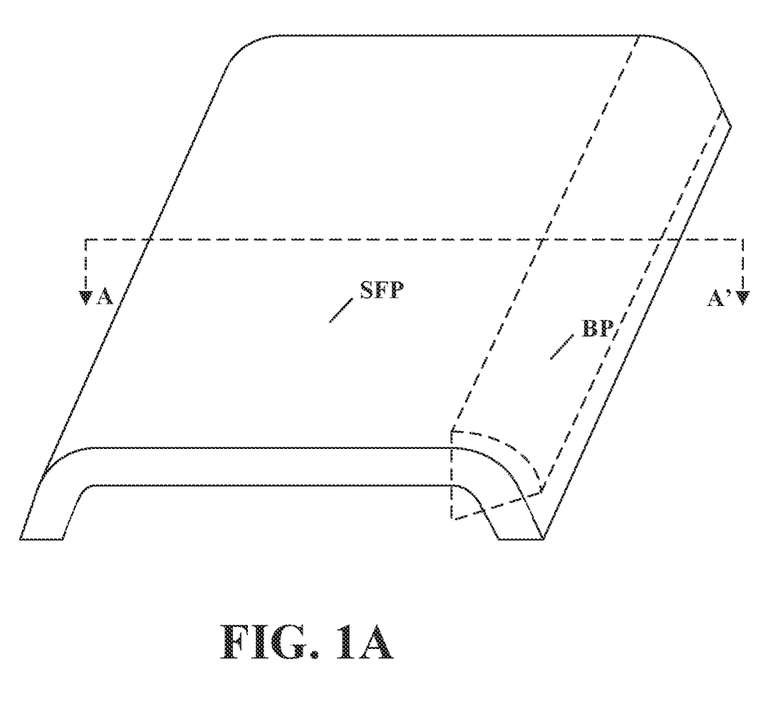
FIG. 1A is a perspective view of a curved display apparatus in some embodiments according to the present disclosure.

FIG. 1A is a perspective view of a curved display apparatus in some embodiments according to the present disclosure. Referring to FIG. 1A, the curved display apparatus in some embodiments includes one or more bending portions BP where the curved display apparatus is bent. In one example, the curved display apparatus further includes a substantially flat portion SFP connected to the one or more bending portions BP.

Figure 1B:
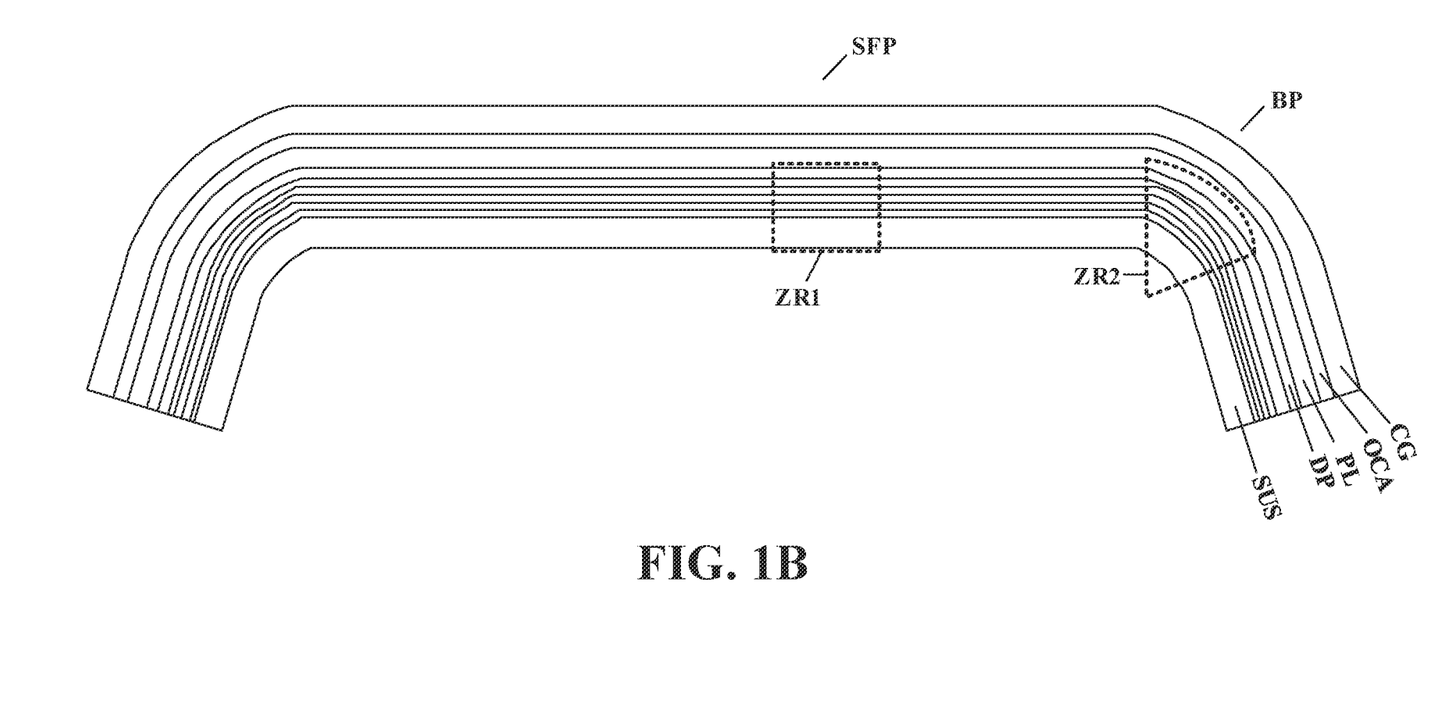
FIG. 1B is a cross-sectional view along an A-A' line in the curved display apparatus of FIG. 1A.
Figure 2A:
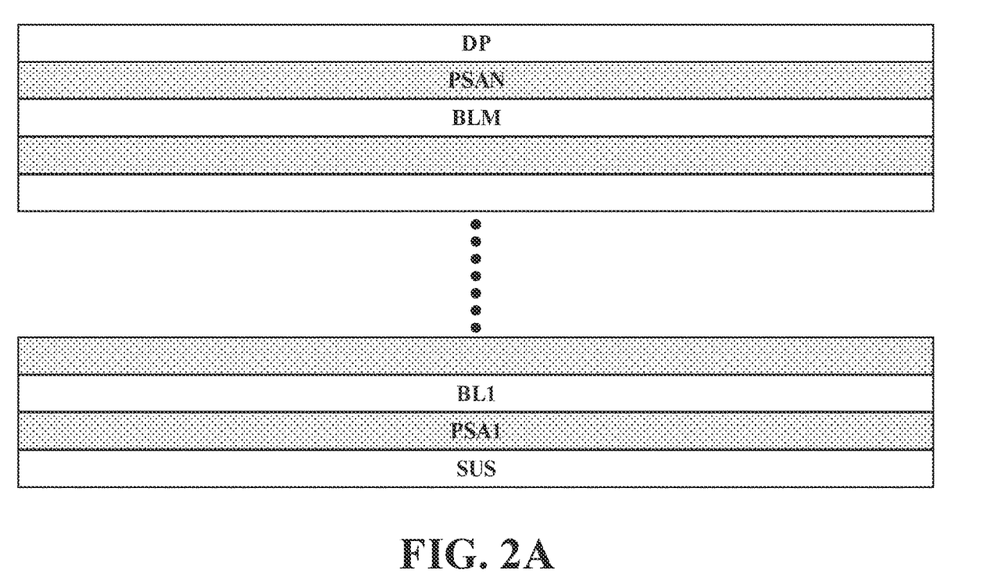
FIG. 2A is a zoom-in cross-sectional view of a first zoom-in region in FIG. 1B.

FIG. 1B is a cross-sectional view along an A-A' line in the curved display apparatus of FIG. 1A. FIG. 2A is a zoom-in cross-sectional view of a first zoom-in region in FIG. 1B. Referring to FIG. 1B and FIG. 2A, the substantially flat portion SFP in some embodiments includes a stacked structure. The stacked structure in some embodiments includes a support layer SUS, a display panel DP on the support layer SUS, and N number of pressure sensitive adhesive layers (PSA1, . . . , PSAN) and M number of flexible base layers (BL1, . . . , BLM) between the support layer and the display panel, N is an integer equal to or greater than 3, M is an integer equal to or greater than 2. As shown in FIG. 1B and FIG. 2A, the N number of pressure sensitive adhesive layers and the M number of flexible base layers are alternately arranged. A first one (PSA1) of the N number of pressure sensitive adhesive layers adheres the support layer SUS and a first one (BL1) of the M number of flexible base layers together. A last one (PSAN) of the N number of pressure sensitive adhesive layers adheres the display panel DP and a last one of the M number of flexible base layers together. The stacked structure in the substantially flat portion SFP is substantially flat.

Figure 2B:
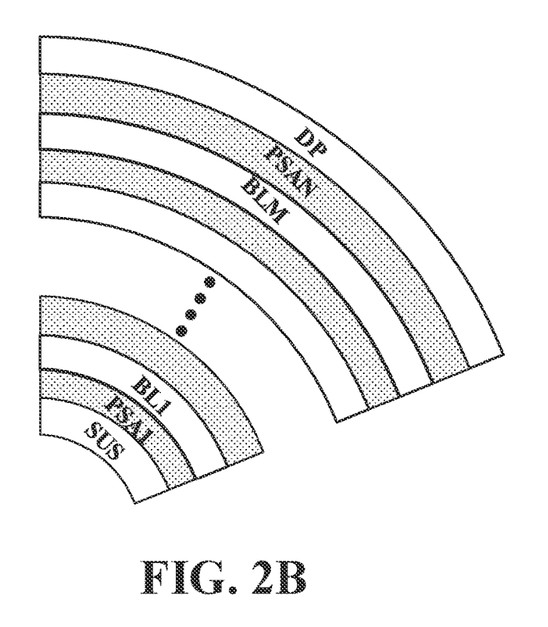
FIG. 2B is a zoom-in cross-sectional view of a second zoom-in region in FIG. 1B.

FIG. 2B is a zoom-in cross-sectional view of a second zoom-in region in FIG. 1B. Referring to FIG. 2B and FIG. 2A, a respective one of the one or more bending portion BP in some embodiments includes a stacked structure. The stacked structure in some embodiments includes a support layer SUS, a display panel DP on the support layer SUS, and N number of pressure sensitive adhesive layers (PSA1, . . . , PSAN) and M number of flexible base layers (BL1, . . . , BLM) between the support layer and the display panel, N is an integer equal to or greater than 3, M is an integer equal to or greater than 2. As shown in FIG. 1B and FIG. 2A, the N number of pressure sensitive adhesive layers and the M number of flexible base layers are alternately arranged. A first one (PSA1) of the N number of pressure sensitive adhesive layers adheres the support layer SUS and a first one (BL1) of the M number of flexible base layers together. A last one (PSAN) of the N number of pressure sensitive adhesive layers adheres the display panel DP and a last one of the M number of flexible base layers together. The stacked structure is bent in the one or more bending portions BP.

As shown in FIG. 1B, FIG. 2A, and FIG. 2B, in some embodiments, the stacked structure is a structure extending throughout the substantially flat portion SFP and the one or more bending portions BP. As shown in FIG. 1B, FIG. 2A, and FIG. 2B, the N number of pressure sensitive adhesive layers and the M number of flexible base layers extend throughout the substantially flat portion SFP and the one or more bending portions BP. Optionally, the support layer SUS extends throughout the substantially flat portion SFP and the one or more bending portions BP. Optionally, the display panel extends throughout the substantially flat portion SFP and the one or more bending portions BP.

Figure 2C:
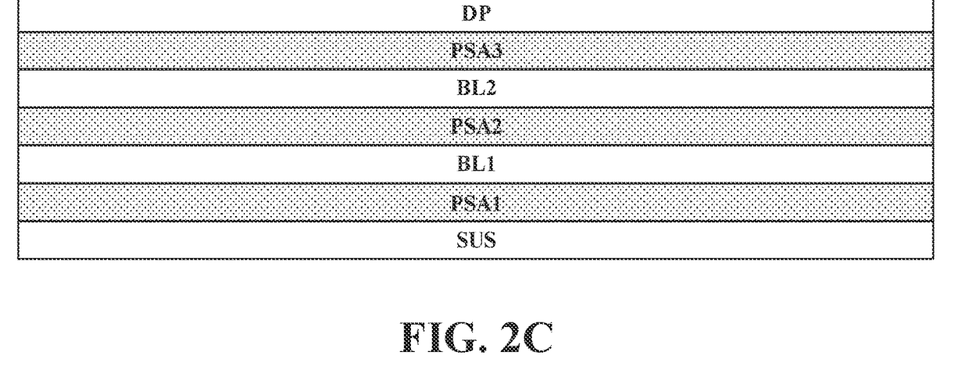
FIG. 2C is a stacked structure in a curved display apparatus in some embodiments according to the present disclosure.

FIG. 2C is a stacked structure in a curved display apparatus in some embodiments according to the present disclosure. Referring to FIG. 2C, in some embodiments, N=3, and M=2. The stacked structure includes a support layer SUS, a first pressure sensitive adhesive layer PSA1 on the support layer SUS, a first flexible base layer BL1 on a side of the first pressure sensitive adhesive layer PSA1 away from the support layer SUS, a second pressure sensitive adhesive layer PSA2 on a side of the first flexible base layer BL1 away from the first pressure sensitive adhesive layer PSA1, a second flexible base layer BL2 on a side of the second pressure sensitive adhesive layer PSA2 away from the first flexible base layer BL1, a third pressure sensitive adhesive layer PSA3 on a side of the second flexible base layer BL2 away from the second pressure sensitive adhesive layer PSA2, and a display panel DP on a side of the third pressure sensitive adhesive layer PSA3 away from the second flexible base layer BL2.

In some embodiments, an n-th pressure sensitive adhesive layer of the N number of pressure sensitive adhesive layers is adhered to two adjacent flexible base layers of the M number of flexible base layers, 1<n<N.

In some embodiments, an m-th flexible base layer of the M number of flexible base layers is adhered to two adjacent pressure sensitive adhesive layers of the N number of pressure sensitive adhesive layers, 1≤m≤M.

The inventors of the present disclosure discover that, surprisingly and unexpectedly, the present stacked structure having N number of pressure sensitive adhesive layers and M number of flexible base layers alternately arranged between the display panel DP and the support layer SUS results in superior adhesion properties adhering the display panel DP and the support layer SUS together. As compared to a single layer adhesive which is typically prone to crack after 24 hours under curving strain and stress when the display panel DP and the support layer SUS are bent, the present structure is unusually resistant to crack or other damages when the display panel DP and the support layer SUS are bent. In particular, the present stacked structure is substantially free of crack for months or longer when the thicknesses of the pressure sensitive adhesive layers and the flexible base layers are within certain selected ranges.

In some embodiments, a respective one of the N number of pressure sensitive adhesive layers has a thickness in a range of 30 µm to 55 µm; a respective one of the M number of flexible base layers has a thickness in a range of 20 µm to 40 µm; and a ratio of a thickness of the respective one of the N number of pressure sensitive adhesive layers to the respective one of the M number of flexible base layers is in a range of 0.75 to 2.75. Optionally, the respective one of the N number of pressure sensitive adhesive layers has a thickness in a range of 30 µm to 35 µm, 35 µm to 40 µm, 40 µm to 45 µm, 45 µm to 50 µm, or 50 µm to 55 µm. Optionally, the respective one of the M number of flexible base layers has a thickness in a range of 20 µm to 25 µm, 25 µm to 30 µm, 30 µm to 35 µm, or 35 µm to 40 µm. Optionally, the ratio of the thickness of the respective one of the N number of pressure sensitive adhesive layers to the thickness of the respective one of the M number of flexible base layers is in a range of 0.75 to 1.0, 1.0 to 1.25, 1.25 to 1.50, 1.50 to 1.75, 1.75 to 2.0, 2.0 to 2.25, 2.25 to 2.5, or 2.5 to 2.75. The inventors of the present disclosure discover that the curved display apparatus is unexpectedly resistant to crack and other damages related to curving strain and stress when the thicknesses of the pressure sensitive adhesive layers and the flexible base layers are within these selected ranges.

Various appropriate materials and various appropriate fabricating methods may be used to make the pressure sensitive adhesive layers. For example, a pressure sensitive adhesive material may be used to form the pressure sensitive adhesive layers. Examples of appropriate pressure sensitive adhesive materials include, but are not limited to, an acrylate-based adhesive material, such as homopolymers and copolymers of acrylic acid, methacrylic acid, isooctyl acrylate, acrylamide, methacrylamide, acrylonitrile, methacrylonitrile, methyl isoamyl acrylate, 2-ethyl hexylacrylate, and butyl acrylate. Optionally, the pressure sensitive adhesive layers are optically clear adhesive layers. Optionally, the pressure sensitive adhesive layers are heat sensitive adhesive layers.

Various appropriate materials and various appropriate fabricating methods may be used to make the flexible base layers. Examples of appropriate flexible materials include, but are not limited to, various polymers such as polyimide, polycarbonate, polyethersulfone, polyethylene terephthalate, polyethylene naphthalate, polyarylate, and fiber-reinforced plastic. Optionally, the flexible base layers include a foam material.

Various appropriate materials and various appropriate fabricating methods may be used to make the support layer SUS. Optionally, the support layer SUS includes an organic material layer. In one example, an organic polymer material may be used to form the organic material layer (e.g., a foam layer). Examples of appropriate organic polymer materials include, but are not limited to, polyethylene terephthalate. Optionally, the support layer SUS includes is a metal support layer. Various appropriate materials and various appropriate fabricating methods may be used to make the metal support layer. For example, a metallic material may be used to form the metal support layer. Examples of appropriate metallic materials include, but are not limited to, aluminum and copper, and various appropriate alloys or laminates.

Referring to FIG. 1B, in some embodiments, the curved display apparatus further includes a polarizer PL on a side of the display panel DP away from the support layer SUS; an optical clear adhesive layer OCA on a side of the polarizer PL away from the display panel DP; and a cover CG on a side of the optical clear adhesive layer OCA away from the polarizer PL. Optionally, the cover CG is a flexible cover glass. Optionally, the cover CG is a flexible cover film.

Various appropriate materials and various appropriate fabricating methods may be used to make the optically clear adhesive layer OCA. Examples of appropriate optically clear adhesive materials include, but are not limited to, polyacrylic, e.g., polymethyl methacrylate (PMMA); cyclic olefin copolymer; polycarbonate; epoxies; silicone-based, optically clear adhesive materials; or a combination thereof.

Various appropriate materials and various appropriate fabricating methods may be used to make the cover CG.

Examples of appropriate materials for making the cover CG include, but are not limited to, polyamine such as colorless polyamine, thin glass, ultrathin glass, polyethylene terephthalate, polyacrylate, polymethylmethacrylate, polycarbonate, polyethylene naphthalate, polyvinylidene chloride, polyvinylidene difluoride, polystyrene, an ethylene vinyl alcohol copolymer, and/or a combination thereof. Optionally, the cover CG has a double-layer structure including a first sub-layer, a second sub-layer, and an adhesive sub-layer adhering the first sub-layer and the second sub-layer together. Optionally, the first sub-layer and the second sub-layer are made of a colorless polyamine, and the adhesive sub-layer is an optically clear adhesive sub-layer. Optionally, the cover CG further includes a hard coating sub-layer. Optionally, the cover CG further includes a protective film.

Optionally, the support layer SUS has a thickness in a range of 50 μm to 200 μm, e.g., 50 μm to 60 μm, 60 μm to 70 μm, 70 μm to 80 μm, 80 μm to 90 μm, 90 μm to 100 μm, 100 μm to 110 μm, 110 μm to 120 μm, 120 μm to 130 μm, 130 μm to 140 μm, 140 μm to 150 μm, 150 μm to 160 μm, 160 μm to 170 μm, 170 μm to 180 μm, 180 μm to 190 μm, or 190 μm to 200 μm. Optionally, the thickness of the support layer SUS is 100 μm.

Optionally, a total thickness of the N number of pressure sensitive adhesive layers and the M number of flexible base layers is in a range of 60 μm to 260 μm, e.g., 60 μm to 70 μm, 70 μm to 80 μm, 80 μm to 90 μm, 90 μm to 100 μm, 100 μm to 110 μm, 110 μm to 120 μm, 120 μm to 130 μm, 130 μm to 140 μm, 140 μm to 150 μm, 150 μm to 160 μm, 160 μm to 170 μm, 170 μm to 180 μm, 180 μm to 190 μm, 190 μm to 200 μm, 200 μm to 210 μm, 210 μm to 220 μm, 220 μm to 230 μm, 230 μm to 240 μm, 240 μm to 250 μm, or 250 μm to 260 μm. Optionally, the total thickness of the N number of pressure sensitive adhesive layers and the M number of flexible base layers is 130 μm.

Optionally, the display panel DP has a thickness in a range of 20 μm to 80 μm, e.g., 20 μm to 30 μm, 30 μm to 40 μm, 40 μm to 50 μm, 50 μm to 60 μm, 60 μm to 70 μm, or 70 μm to 80 μm. Optionally, the thickness of the display panel DP is 38 μm.

Optionally, the polarizer PL has a thickness in a range of 35 μm to 130 μm, e.g., 35 μm to 40 μm, 40 μm to 50 μm, 50 μm to 60 μm, 60 μm to 70 μm, 70 μm to 80 μm, 90 μm to 100 μm, 100 μm to 110 μm, 110 μm to 120 μm, or 120 μm to 130 μm. Optionally, the thickness of the polarizer PL is 67 μm.

Optionally, the optically clear adhesive layer OCA has a thickness in a range of 25 μm to 100 μm, e.g., 25 μm to 30 μm, 30 μm to 40 μm, 40 μm to 50 μm, 50 μm to 60 μm, 60 μm to 70 μm, 70 μm to 80 μm, 80 μm to 90 μm, or 90 μm to 100 μm. Optionally, the thickness of the optically clear adhesive layer OCA is 50 μm.

Optionally, the cover CG has a thickness in a range of 45 μm to 180 μm, e.g., 45 μm to 50 μm, 50 μm to 60 μm, 60 μm to 70 μm, 70 μm to 80 μm, 90 μm to 100 μm, 100 μm to 110 μm, 110 μm to 120 μm, 120 μm to 130 μm, 130 μm to 140 μm, 140 μm to 150 μm, 150 μm to 160 μm, 160 μm to 170 μm, or 170 μm to 180 μm. Optionally, the thickness of the cover CG is 90 μm.

In another aspect, the present disclosure provides a method of fabricating a curved display apparatus. In some embodiments, the method includes providing a display panel; providing a support layer; adhering the display panel and the support layer using N number of pressure sensitive adhesive layers and M number of flexible base layers, N is an integer equal to or greater than 3, M is an integer equal to or greater than 2; and bending an assembly including the display panel, the support layer, the N number of pressure sensitive adhesive layers, and the M number of flexible base layers, thereby forming one or more bending portions in the assembly. Optionally, adhering the display panel and the support layer includes adhering a first one of the N number of pressure sensitive adhesive layers to a surface of the support layer, thereby adhering the support layer and a first one of the M number of flexible base layers together; and adhering a display panel to a last one of the N number of pressure sensitive adhesive layers, thereby adhering the display panel and a last one of the M number of flexible base layers together. Optionally, at least the one or more bending portions is formed to include a stacked structure including sequentially the support layer, the N number of pressure sensitive adhesive layers and the M number of flexible base layers, and the display panel. Optionally, the N number of pressure sensitive adhesive layers and the M number of flexible base layers are alternately arranged. Optionally, a respective one of the N number of pressure sensitive adhesive layers has a thickness in a range of 30 μm to 55 μm. Optionally, a respective one of the M number of flexible base layers has a thickness in a range of 20 μm to 40 μm. Optionally, a ratio of the thickness of the respective one of the N number of pressure sensitive adhesive layers to the thickness of the respective one of the M number of flexible base layers is in a range of 0.75 to 2.75. Optionally, the ratio of the thickness of the respective one of the N number of pressure sensitive adhesive layers to the thickness of the respective one of the M number of flexible base layers is in a range of 1.5 to 1.375.

In some embodiments, bending the assembly further forms a substantially flat portion connected to the one or more bending portions. Optionally, the stacked structure is a structure extending throughout the substantially flat portion and the one or more bending portions. Optionally, the stacked structure is bent in the one or more bending portions. Optionally, the N number of pressure sensitive adhesive layers and the M number of flexible base layers extend throughout the substantially flat portion and the one or more bending portions.

In some embodiments, the method further includes forming a polarizer on a side of the display panel away from the support layer; forming an optical clear adhesive layer on a side of the polarizer away from the display panel; and forming a cover on a side of the optical clear adhesive layer away from the polarizer.

Figure 3A:
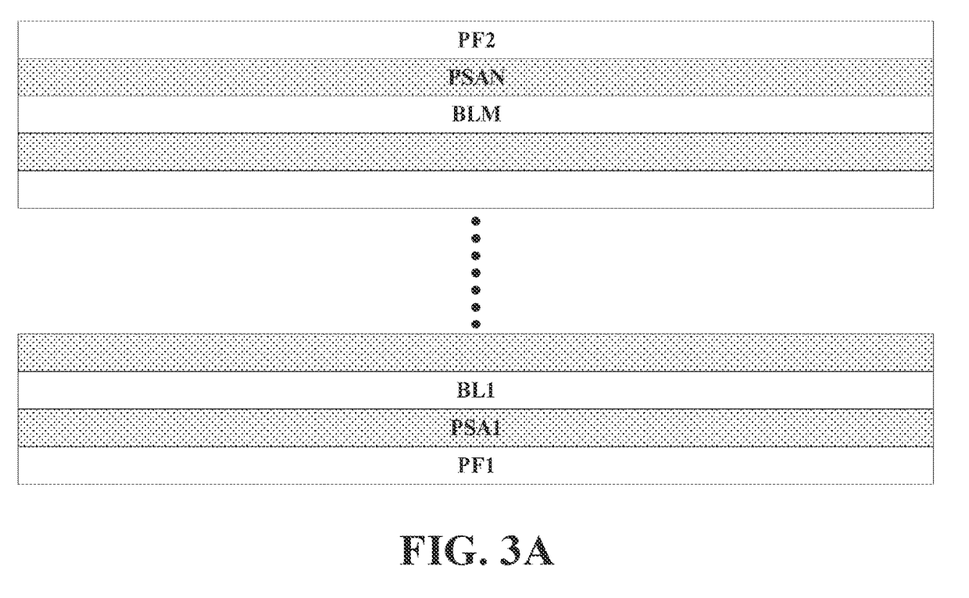
FIG. 3A is a diagram illustrating an adhesive module in some embodiments according to the present disclosure.
Figure 3B:
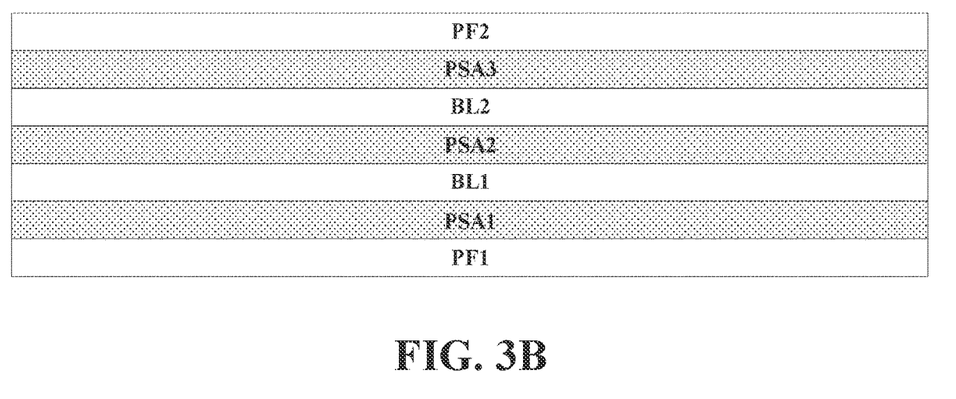
FIG. 3B is a diagram illustrating an adhesive module in some embodiments according to the present disclosure.

In some embodiments, the method further includes forming an adhesive module. FIG. 3A is a diagram illustrating an adhesive module in some embodiments according to the present disclosure. Referring to FIG. 3A, forming the adhesive module in some embodiments includes forming a stacked structure including N number of pressure sensitive adhesive layers (PSA1, . . . , PSAN) and M number of flexible base layers (BL1, . . . , BLM) alternately stacked together, a first protective film PF1, and a second protective film PF2. An n-th pressure sensitive adhesive layer of the N number of pressure sensitive adhesive layers is adhered to two adjacent flexible base layers of the M number of flexible base layers, 1<n<N. An m-th flexible base layer of the M number of flexible base layers is adhered to two adjacent pressure sensitive adhesive layers of the N number of pressure sensitive adhesive layers, 1≤m≤M. A first one of the N number of pressure sensitive adhesive layers adheres the first protective film PF1 and a first one of the M number of flexible base layers together. A last one of the N number of pressure sensitive adhesive layers adheres the second protective film PF2 and a last one of the M number of flexible base layers together. FIG. 3B is a diagram illustrating an adhesive module in some embodiments according to the present disclosure. FIG. 3B shows an embodiment in which N=3 and M=2.

Various appropriate materials and various appropriate fabricating methods may be used to make the protective films. Examples of appropriate protective film materials include, but are not limited to, various polymers such as polyethylene terephthalate, plastic, and fiber-containing material.

Various layers of the adhesive module may be assembled together using various appropriate methods such as coating and roll-to-roll processing. In a roll-to-roll process, a first flexible material (such as a pressure sensitive adhesive layer or a flexible base layer) is dispensed continuously from a first roll, optionally processed, and re-wound onto a second roll, where it is adhered to or laminated to a second flexible material (such as another flexible base layer or another pressure sensitive adhesive layer).

In the present adhesive module, a respective one of the N number of pressure sensitive adhesive layers has a thickness in a range of 30 μm to 55 μm; a respective one of the M number of flexible base layers has a thickness in a range of 20 μm to 40 μm; and a ratio of a thickness of the respective one of the N number of pressure sensitive adhesive layers to the respective one of the M number of flexible base layers is in a range of 0.75 to 2.75. Optionally, the respective one of the N number of pressure sensitive adhesive layers has a thickness in a range of 30 μm to 35 μm, 35 μm to 40 μm, 40 μm to 45 μm, 45 μm to 50 μm, or 50 μm to 55 μm. Optionally, the respective one of the M number of flexible base layers has a thickness in a range of 20 μm to 25 μm, 25 μm to 30 μm, 30 μm to 35 μm, or 35 μm to 40 μm. Optionally, the ratio of the thickness of the respective one of the N number of pressure sensitive adhesive layers to the thickness of the respective one of the M number of flexible base layers is in a range of 0.75 to 1.0, 1.0 to 1.25, 1.25 to 1.50, 1.50 to 1.75, 1.75 to 2.0, 2.0 to 2.25, 2.25 to 2.5, or 2.5 to 2.75. The inventors of the present disclosure discover that the present adhesive module is unexpectedly resistant to crack and other damages related to curving strain and stress when the thicknesses of the pressure sensitive adhesive layers and the flexible base layers are within these selected ranges.

Figure 3C:
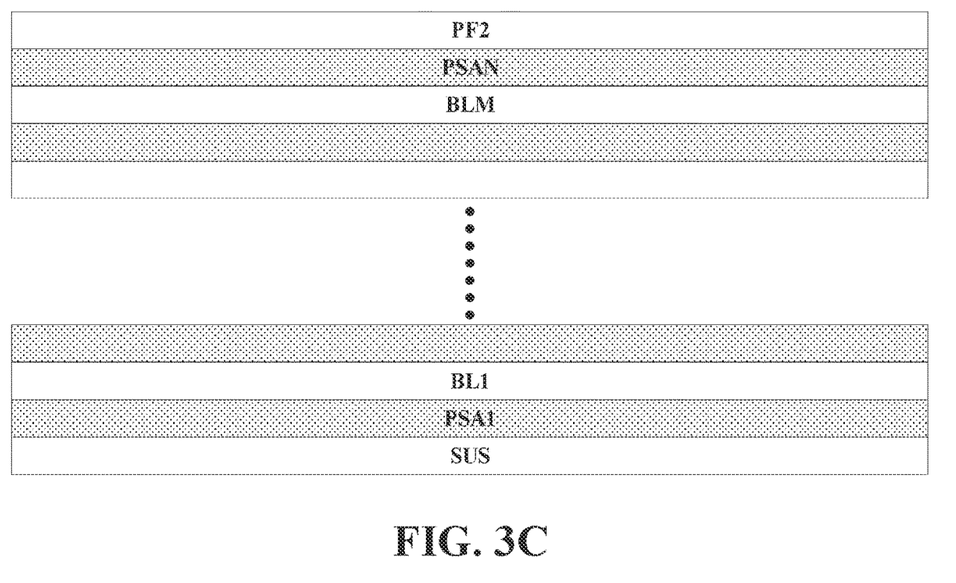
FIG. 3C is a diagram illustrating an adhesive support module in some embodiments according to the present disclosure.

In some embodiments, the method further includes forming an adhesive support module for bending the display panel. FIG. 3C is a diagram illustrating an adhesive support module in some embodiments according to the present disclosure. Referring to FIG. 3C, the adhesive support module in some embodiments includes a stacked structure including a support layer SUS, N number of pressure sensitive adhesive layers (PSA1, . . . , PSAN) and M number of flexible base layers (BL1, . . . , BLM) alternately stacked together and adhered to a surface of the support layer SUS, and a second protective film PF2. A first one of the N number of pressure sensitive adhesive layers adheres the support layer SUS and a first one of the M number of flexible base layers together. A last one of the N number of pressure sensitive adhesive layers adheres the second protective film PF2 and a last one of the M number of flexible base layers together.

Figure 4A:
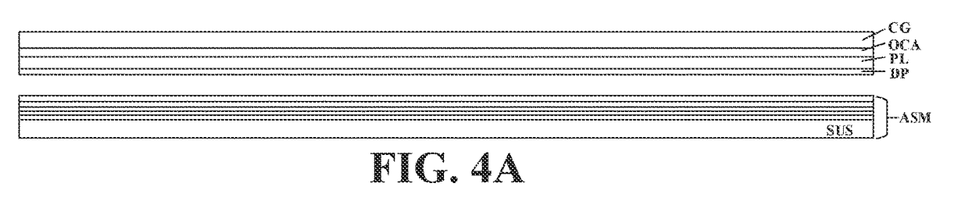
FIG. 4A to FIG. 4C illustrate a method of fabricating a curved display apparatus in some embodiments according to the present disclosure.
Figure 4B:
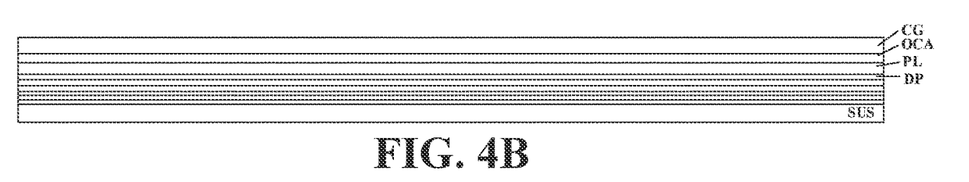
Figure 4C:
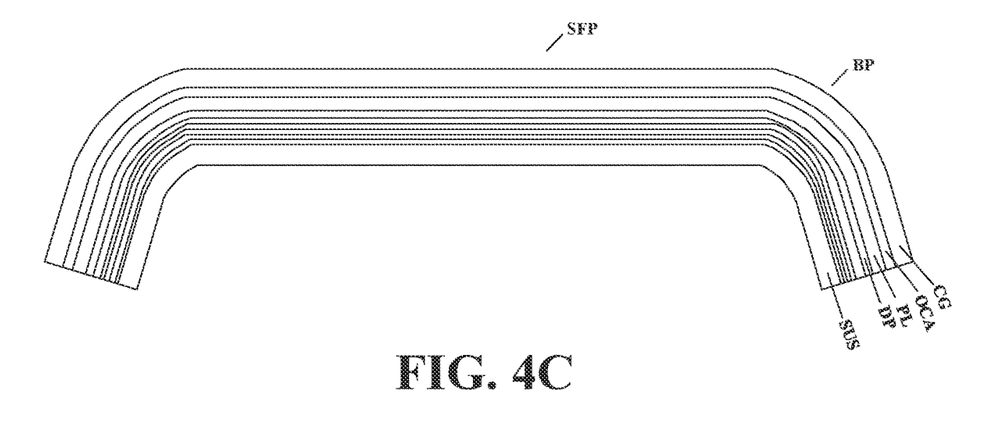

FIG. 4A to FIG. 4C illustrate a method of fabricating a curved display apparatus in some embodiments according to the present disclosure. Referring to FIG. 4A, the method in some embodiment includes providing an adhesive support module ASM with the protective film (e.g., the second protective film PF2 in FIG. 3C) removed, and providing a display module including a display panel DP, a polarizer PL, an optical clear adhesive layer OCA, and a cover CG. The adhesive support module ASM and the display module are aligned with respect to each other. Referring to FIG. 4B, the display module is adhered to the adhesive support module ASM, a surface of the display panel is adhered to a last pressure sensitive adhesive layer in the adhesive support module ASM to form a display apparatus. Referring to FIG. 4C, the display apparatus is bent to form one or more bending portions BP and a substantially flat portion SFP, thereby forming the curved display apparatus. The inventors of the present disclosure discover that the curved display apparatus fabricated by the present method is unexpectedly resistant to crack and other damages related to curving strain and stress, particularly when the thicknesses of the pressure sensitive adhesive layers and the flexible base layers are within certain selected ranges.

Examples of appropriate curved display apparatuses include, but are not limited to, an electronic paper, a mobile phone, a tablet computer, a television, a monitor, a notebook computer, a digital album, a GPS, etc. Optionally, the curved display apparatus further includes one or more integrated circuits connected to the display panel. Optionally, the display panel is an organic light emitting diode display panel. Optionally, the display panel is micro light emitting diode display panel.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:
1. A curved display apparatus, comprising one or more bending portions where the curved display apparatus is bent;

wherein at least the one or more bending portions of the curved display apparatus comprises a stacked structure comprising:
a support layer;
a display panel on the support layer; and
N number of pressure sensitive adhesive layers and M number of flexible base layers between the support layer and the display panel, N is an integer equal to or greater than 3, M is an integer equal to or greater than 2;
wherein the N number of pressure sensitive adhesive layers and the M number of flexible base layers are alternately arranged;
a first one of the N number of pressure sensitive adhesive layers adheres the support layer and a first one of the M number of flexible base layers together;
a last one of the N number of pressure sensitive adhesive layers adheres the display panel and a last one of the M number of flexible base layers together;
a respective one of the N number of pressure sensitive adhesive layers has a thickness in a range of 30 μm to 55 μm;
a respective one of the M number of flexible base layers has a thickness in a range of 20 μm to 40 μm; and
a ratio of the thickness of the respective one of the N number of pressure sensitive adhesive layers to the thickness of the respective one of the M number of flexible base layers is in a range of 0.75 to 2.75;
wherein the stacked structure further comprises:
a polarizer on a side of the display panel away from the support layer;
an optical clear adhesive layer on a side of the polarizer away from the display panel; and
a cover on a side of the optical clear adhesive layer away from the polarizer.

2. The curved display apparatus of claim 1, wherein the ratio of the thickness of the respective one of the N number of pressure sensitive adhesive layers to the thickness of the respective one of the M number of flexible base layers is in a range of 1.5 to 1.375.

3. The curved display apparatus of claim 1, further comprising a substantially flat portion connected to the one or more bending portions;
wherein the stacked structure is a structure extending throughout the substantially flat portion and the one or more bending portions;
the stacked structure is bent in the one or more bending portions; and
the N number of pressure sensitive adhesive layers and the M number of flexible base layers extend throughout the substantially flat portion and the one or more bending portions.

4. The curved display apparatus of claim 1, wherein the support layer is a metal support layer.

5. The curved display apparatus of claim 1, wherein the respective one of the N number of pressure sensitive adhesive layers comprises an acrylate-based adhesive material; and
the respective one of the M number of flexible base layers comprises an organic material.

6. The curved display apparatus of claim 1, wherein an n-th pressure sensitive adhesive layer of the N number of pressure sensitive adhesive layers is adhered to two adjacent flexible base layers of the M number of flexible base layers, $1<n<N$; and
an m-th flexible base layer of the M number of flexible base layers is adhered to two adjacent pressure sensitive adhesive layers of the N number of pressure sensitive adhesive layers, $1 \leq m \leq M$.

7. A method of fabricating a curved display apparatus, comprising:
providing a display panel;
providing a support layer;
adhering the display panel and the support layer using N number of pressure sensitive adhesive layers and M number of flexible base layers, N is an integer equal to or greater than 3, M is an integer equal to or greater than 2; and
bending an assembly comprising the display panel, the support layer, the N number of pressure sensitive adhesive layers, and the M number of flexible base layers, thereby forming one or more bending portions in the assembly;
wherein adhering the display panel and the support layer comprises:
adhering a first one of the N number of pressure sensitive adhesive layers to a surface of the support layer, thereby adhering the support layer and a first one of the M number of flexible base layers together; and
adhering a display panel to a last one of the N number of pressure sensitive adhesive layers, thereby adhering the display panel and a last one of the M number of flexible base layers together;
wherein at least the one or more bending portions is formed to comprise a stacked structure comprising sequentially the support layer, the N number of pressure sensitive adhesive layers and the M number of flexible base layers, and the display panel;
the N number of pressure sensitive adhesive layers and the M number of flexible base layers are alternately arranged;
a respective one of the N number of pressure sensitive adhesive layers has a thickness in a range of 30 μm to 55 μm;
a respective one of the M number of flexible base layers has a thickness in a range of 20 μm to 40 μm; and
a ratio of the thickness of the respective one of the N number of pressure sensitive adhesive layers to the thickness of the respective one of the M number of flexible base layers is in a range of 0.75 to 2.75;
wherein the method further comprising:
forming a polarizer on a side of the display panel away from the support layer;
forming an optical clear adhesive layer on a side of the polarizer away from the display panel; and
forming a cover on a side of the optical clear adhesive layer away from the polarizer.

8. The method of claim 7, wherein the ratio of the thickness of the respective one of the N number of pressure sensitive adhesive layers to the thickness of the respective one of the M number of flexible base layers is in a range of 1.5 to 1.375.

9. The method of claim 7, wherein bending the assembly further forms a substantially flat portion connected to the one or more bending portions;
wherein the stacked structure is a structure extending throughout the substantially flat portion and the one or more bending portions;
the stacked structure is bent in the one or more bending portions; and
the N number of pressure sensitive adhesive layers and the M number of flexible base layers extend throughout the substantially flat portion and the one or more bending portions.

10. The method of claim 7, further comprising forming an adhesive module by forming a stacked structure comprising the N number of pressure sensitive adhesive layers and the M number of flexible base layers alternately stacked together, a first protective film, and a second protective film.

11. The method of claim 10, further comprising forming an adhesive support module;
   wherein forming the adhesive support module comprises:
   removing the first protective film from the adhesive module; and
   adhering the support layer to the first one of the N number of pressure sensitive adhesive layers to the surface of the support layer.

12. The method of claim 11, further comprising:
   removing the second protective film from the adhesive module; and
   adhering the display panel to the last one of the N number of pressure sensitive adhesive layers.

\* \* \* \* \*